(12) United States Patent
Shih et al.

(10) Patent No.: US 12,484,231 B2
(45) Date of Patent: Nov. 25, 2025

(54) FERROELECTRIC MEMORY STRUCTURE

(71) Applicant: Powerchip Semiconductor Manufacturing Corporation, Hsinchu (TW)

(72) Inventors: Jyun-Hong Shih, Hsinchu (TW); Min-Cheng Chen, Hsinchu County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 391 days.

(21) Appl. No.: 18/356,176

(22) Filed: Jul. 20, 2023

(65) Prior Publication Data

US 2024/0357827 A1 Oct. 24, 2024

(30) Foreign Application Priority Data

Apr. 19, 2023 (TW) .................. 112114619

(51) Int. Cl.
*H10B 51/20* (2023.01)
*H01L 23/528* (2006.01)
(Continued)

(52) U.S. Cl.
CPC ......... *H10B 51/20* (2023.02); *H01L 23/5283* (2013.01); *H10B 51/10* (2023.02); *H10B 51/30* (2023.02)

(58) Field of Classification Search
CPC ..... H01L 23/5283; H10B 51/10; H10B 51/20; H10B 51/30
See application file for complete search history.

(56) References Cited

U.S. PATENT DOCUMENTS

| | | | |
|---|---|---|---|
| 9,281,044 B2 | 3/2016 | Ramaswamy et al. | |
| 9,685,484 B1 * | 6/2017 | Rabkin | H10B 63/84 |

(Continued)

FOREIGN PATENT DOCUMENTS

| | | | |
|---|---|---|---|
| CN | 108962905 A * | 12/2018 | ............ H10B 43/27 |
| CN | 113871395 | 12/2021 | |

(Continued)

OTHER PUBLICATIONS

Hyunwoo Chung et al., "Novel 4F2 Dram Cell with Vertical Pillar Transistor(VPT)", 2011 Proceedings of the European Solid-State Device Research Conference, Sep. 12-16, 2011, pp. 211-214.

(Continued)

*Primary Examiner* — Matthew E Warren
(74) *Attorney, Agent, or Firm* — JCIPRNET

(57) ABSTRACT

A ferroelectric memory structure including a substrate, first and second conductive lines, first and second dielectric layers, a channel pillar, a gate pillar, and a ferroelectric material layer is provided. The first conductive line is located on the substrate. The first dielectric layer is located on the first conductive line. The channel pillar is located on the first conductive line and in the first dielectric layer. The second conductive line is located on the first dielectric layer and the channel pillar. The gate pillar passes through the second conductive line and is located in the channel pillar. The second dielectric layer is located between the gate pillar and the first conductive line, between the gate pillar and the channel pillar, and between the gate pillar and the second conductive line. The ferroelectric material layer is located between the gate pillar and the second dielectric layer.

20 Claims, 3 Drawing Sheets

(51) Int. Cl.
   *H10B 51/10*      (2023.01)
   *H10B 51/30*      (2023.01)

(56) References Cited

U.S. PATENT DOCUMENTS

| | | | |
|---|---|---|---|
| 2021/0320111 A1 | 10/2021 | Yeong et al. | |
| 2022/0130862 A1 | 4/2022 | Lue | |
| 2022/0358983 A1 | 11/2022 | Wang et al. | |
| 2022/0399339 A1* | 12/2022 | Chen | H10B 12/05 |
| 2023/0309314 A1* | 9/2023 | Lee | H10B 51/10 |
| 2024/0130138 A1* | 4/2024 | Hayakawa | H10B 51/40 |

FOREIGN PATENT DOCUMENTS

| | | | |
|---|---|---|---|
| TW | 202006895 | 2/2020 | |
| TW | 202101742 | 1/2021 | |
| WO | WO-2022153676 A1 * | 7/2022 | H10D 84/837 |

OTHER PUBLICATIONS

Fei Mo et al., "Low-Voltage Operating Ferroelectric FET with Ultrathin IGZO Channel for High-Density Memory Application", Journal of the Electron Devices Society, Jul. 13, 2020, pp. 717-723, vol. 8.
"Office Action of Taiwan Counterpart Application", issued on Dec. 25, 2023, p. 1-p. 5.

* cited by examiner

FERROELECTRIC MEMORY STRUCTURE

CROSS-REFERENCE TO RELATED APPLICATION

This application claims the priority benefit of Taiwanese application no. 112114619, filed on Apr. 19, 2023. The entirety of the above-mentioned patent application is hereby incorporated by reference herein and made a part of this specification.

BACKGROUND

Technical Field

The invention relates to a memory structure, and particularly relates to a ferroelectric memory structure.

Description of Related Art

The ferroelectric memory is a kind of non-volatile memory and has the advantage that the stored data will not disappear when power is off. In addition, compared with other non-volatile memories, the ferroelectric memory have the characteristics of high reliability and fast operation speed. Furthermore, U.S. Pat. No. 9,281,044 discloses a memory array including a ferroelectric field effect transistor (FeFET). However, how to further reduce the device size of the ferroelectric memory and improve the electrical performance of the ferroelectric memory are the goals of continuous efforts.

SUMMARY

The invention provides a ferroelectric memory structure, which can have a smaller device size and better electrical performance.

The invention provides a ferroelectric memory structure, which includes a substrate, a first conductive line, a first dielectric layer, a channel pillar, a second conductive line, a gate pillar, a second dielectric layer, and a ferroelectric material layer. The first conductive line is located on the substrate. The first dielectric layer is located on the first conductive line. The channel pillar is located on the first conductive line and is located in the first dielectric layer. The second conductive line is located on the first dielectric layer and the channel pillar. The gate pillar passes through the second conductive line and is located in the channel pillar. The second dielectric layer is located between the gate pillar and the first conductive line, between the gate pillar and the channel pillar, and between the gate pillar and the second conductive line. The ferroelectric material layer is located between the gate pillar and the second dielectric layer.

According to an embodiment of the invention, in the ferroelectric memory structure, the channel pillar may be located between the first conductive line and the second conductive line.

According to an embodiment of the invention, in the ferroelectric memory structure, the channel pillar may be in direct contact with the first conductive line and the second conductive line.

According to an embodiment of the invention, in the ferroelectric memory structure, the material of the channel pillar may include oxide semiconductor (OS).

According to an embodiment of the invention, in the ferroelectric memory structure, the material of the channel pillar may include indium gallium zinc oxide (IGZO).

According to an embodiment of the invention, in the ferroelectric memory structure, the top surface of the channel pillar and the top surface of the first dielectric layer may be coplanar.

According to an embodiment of the invention, in the ferroelectric memory structure, the top surface of the gate pillar, the top surface of the ferroelectric material layer, and the top surface of the second dielectric layer may be coplanar.

According to an embodiment of the invention, in the ferroelectric memory structure, the second dielectric layer may be located between the ferroelectric material layer and the first conductive line, between the ferroelectric material layer and the channel pillar, and between the ferroelectric material layer and the second conductive line.

According to an embodiment of the invention, in the ferroelectric memory structure, the top-view pattern of the channel pillar may surround the top-view pattern of the gate pillar, the top-view pattern of the ferroelectric material layer, and the top-view pattern of the second dielectric layer.

According to an embodiment of the invention, in the ferroelectric memory structure, the top-view pattern of the second conductive line may surround the top-view pattern of the gate pillar, the top-view pattern of the ferroelectric material layer, and the top-view pattern of the second dielectric layer.

According to an embodiment of the invention, in the ferroelectric memory structure, the top-view pattern of the second dielectric layer may surround the top-view pattern of the gate pillar and the top-view pattern of the ferroelectric material layer.

According to an embodiment of the invention, in the ferroelectric memory structure, the top-view pattern of the ferroelectric material layer may surround the top-view pattern of the gate pillar.

According to an embodiment of the invention, in the ferroelectric memory structure, the material of the ferroelectric material layer may include hafnium zirconium oxide ($HfZrO_x$).

According to an embodiment of the invention, the ferroelectric memory structure may further include a third conductive line. The third conductive line is electrically connected to the gate pillar.

According to an embodiment of the invention, in the ferroelectric memory structure, the third conductive line may be located on the gate pillar.

According to an embodiment of the invention, in the ferroelectric memory structure, the third conductive line may be further located on the ferroelectric material layer and the second dielectric layer.

According to an embodiment of the invention, in the ferroelectric memory structure, the extension direction of the third conductive line may intersect the extension direction of the first conductive line and the extension direction of the second conductive line.

According to an embodiment of the invention, the ferroelectric memory structure may further include a third dielectric layer. The third dielectric layer is located on the second conductive line.

According to an embodiment of the invention, in the ferroelectric memory structure, the gate pillar may pass through the third dielectric layer.

According to an embodiment of the invention, in the ferroelectric memory structure, the third conductive line may be located on the third dielectric layer.

Based on the above description, in the ferroelectric memory structure according to the invention, the first dielectric layer is located on the first conductive line. The channel pillar is located on the first conductive line and is located in the first dielectric layer. The second conductive line is located on the first dielectric layer and the channel pillar. The gate pillar passes through the second conductive line and is located in the channel pillar. The second dielectric layer is located between the gate pillar and the first conductive line, between the gate pillar and the channel pillar, and between the gate pillar and the second conductive line. The ferroelectric material layer is located between the gate pillar and the second dielectric layer. Therefore, the ferroelectric memory structure according to the invention can have a smaller device size, a larger gate width, and better electrical performance (e.g., low leakage current and low parasitic capacitance). In addition, the manufacturing process of the ferroelectric memory structure according to the invention can be easily integrated with the manufacturing process of other semiconductor devices.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

Figure 1:
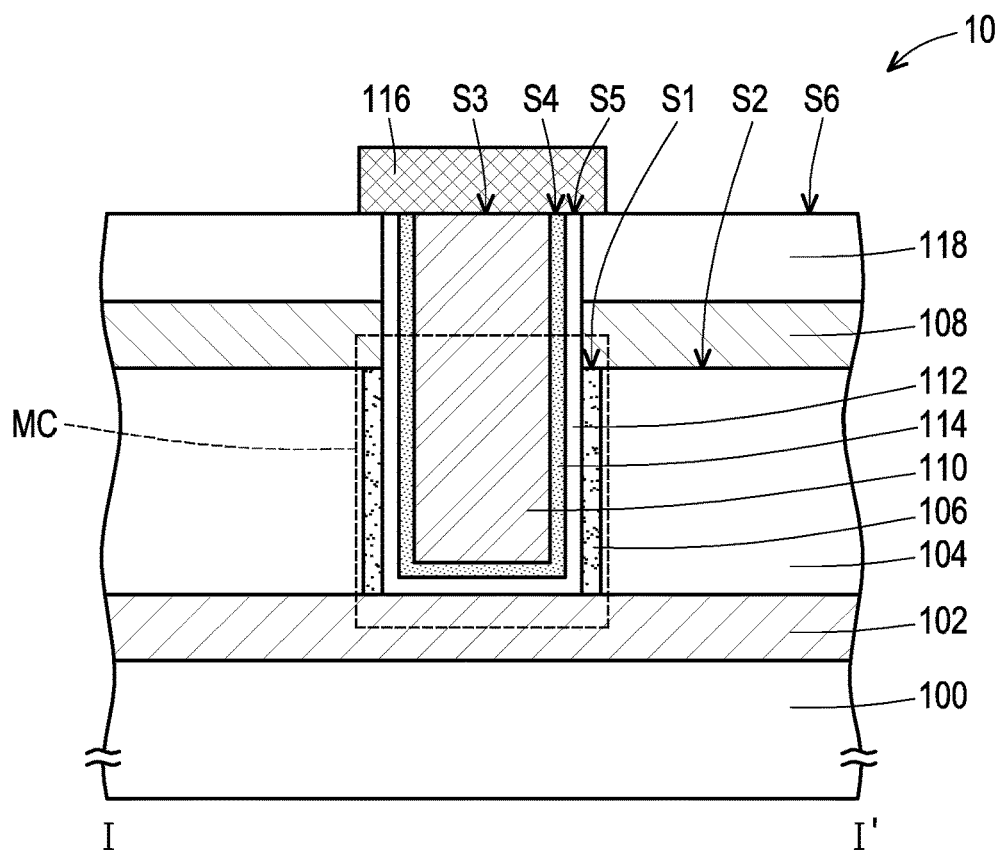
FIG. 1 is a cross-sectional view of a ferroelectric memory structure according to some embodiments of the invention.
Figure 2:
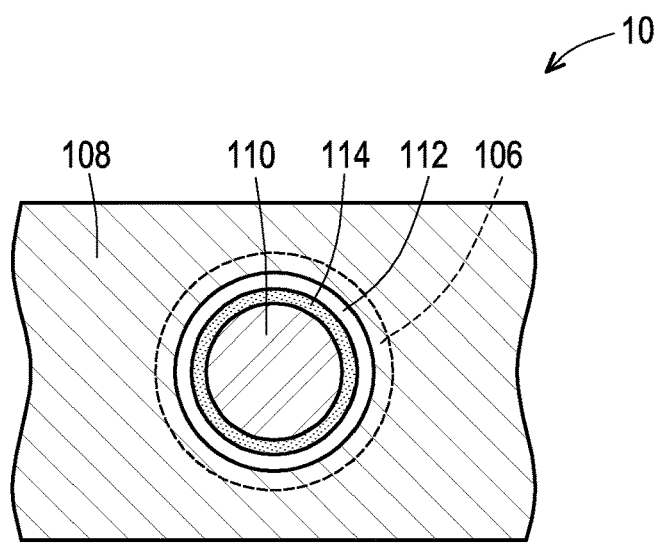
FIG. 2 is a top view of some components in FIG. 1.
Figure 3:
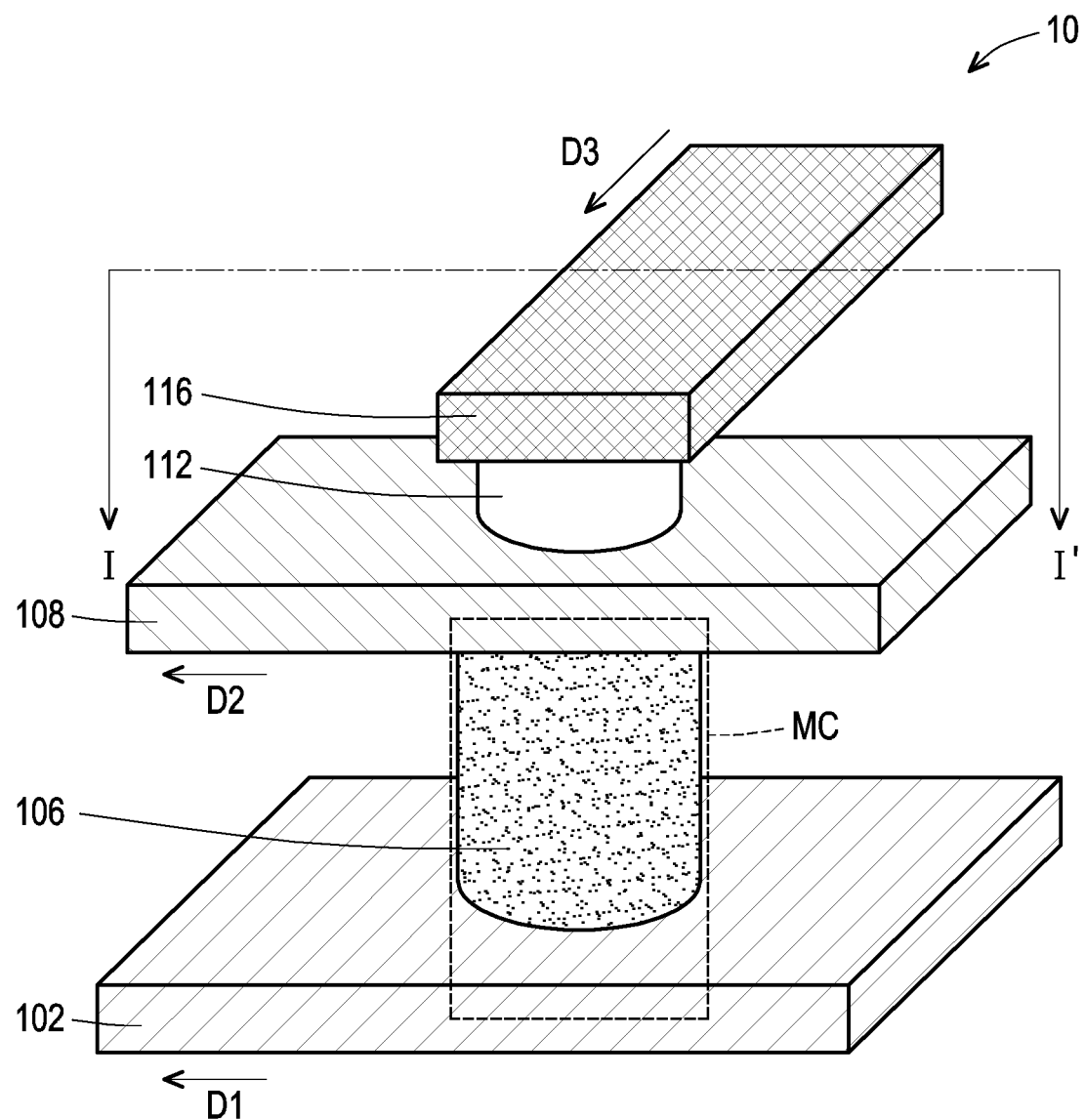
FIG. 3 is a perspective view of some components in FIG. 1.
Figure 4:
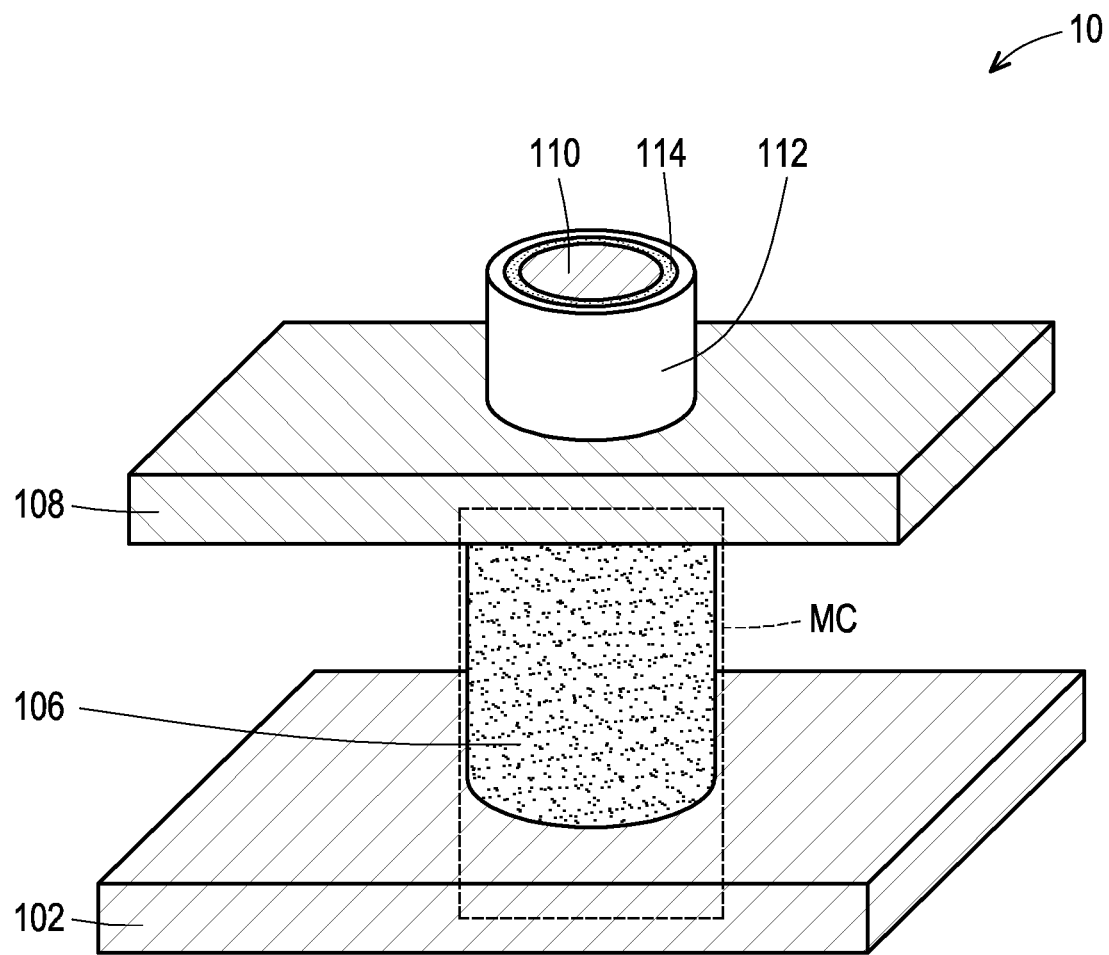
FIG. 4 is a perspective view of some components in FIG. 1.

FIG. 1 is a cross-sectional view of a ferroelectric memory structure according to some embodiments of the invention. FIG. 2 is a top view of some components in FIG. 1. FIG. 3 is a perspective view of some components in FIG. 1. FIG. 1 is a cross-sectional view taken along section line I-I' in FIG. 3. FIG. 4 is a perspective view of some components in FIG. 1. In FIG. 2 to FIG. 4, some components in FIG. 1 are omitted to clearly illustrate the configuration relationship between the components in FIG. 2 to FIG. 4.

Referring to FIG. 1 to FIG. 4, a ferroelectric memory structure 10 includes a substrate 100, a conductive line 102, a dielectric layer 104, a channel pillar 106, a conductive line 108, a gate pillar 110, a dielectric layer 112, and a ferroelectric material layer 114. In some embodiments, the substrate 100 may be a semiconductor substrate such as a silicon substrate. Although not shown in the figure, the substrate 100 may have required components (e.g., dielectric layer, interconnect structure, active device and/or passive device) thereon. In some embodiments, the conductive line 102 may be used as a source line, and the conductive line 108 may be used as a bit line, but the invention is not limited thereto. In other embodiments, the conductive line 102 may be used as a bit line, and the conductive line 108 may be used as a source line.

The conductive line 102 is located on the substrate 100. In some embodiments, as shown in FIG. 3, the conductive line 102 may extend in the extension direction D1. In some embodiments, the material of the conductive line 102 may include a conductive material such as metal. In some embodiments, the material of the conductive line 102 may include tungsten, copper, or aluminum.

The dielectric layer 104 is located on the conductive line 102. In some embodiments, the material of the dielectric layer 104 may include silicon oxide.

The channel pillar 106 is located on the conductive line 102 and is located in the dielectric layer 104. In some embodiments, the top surface S1 of the channel pillar 106 and the top surface S2 of the dielectric layer 104 may be coplanar. In some embodiments, the material of the channel pillar 106 may include an oxide semiconductor. In some embodiments, the material of the channel pillar 106 may include indium gallium zinc oxide (IGZO).

The conductive line 108 is located on the dielectric layer 104 and the channel pillar 106. In some embodiments, the channel pillar 106 may be located between the conductive line 102 and the conductive line 108. In some embodiments, the channel pillar 106 may be in direct contact with the conductive line 102 and the conductive line 108. In some embodiments, as shown in FIG. 3, the conductive line 108 may extend in the extension direction D2. In some embodiments, the extension direction D2 of the conductive line 108 may be parallel to the extension direction D1 of the conductive line 102. In some embodiments, the material of the conductive line 108 may include a conductive material such as metal. In some embodiments, the material of the conductive line 108 may include tungsten, copper, or aluminum.

The gate pillar 110 passes through the conductive line 108 and is located in the channel pillar 106. In some embodiments, the material of the gate pillar 110 may include a conductive material such as metal. In some embodiments, the material of the gate pillar 110 may include tungsten, copper, or aluminum.

The dielectric layer 112 is located between the gate pillar 110 and the conductive line 102, between the gate pillar 110 and the channel pillar 106, and between the gate pillar 110 and the conductive line 108. In some embodiments, the material of the dielectric layer 112 may include silicon oxide or a high dielectric constant material.

The ferroelectric material layer 114 is located between the gate pillar 110 and the dielectric layer 112. In some embodiments, the dielectric layer 112 may be located between the ferroelectric material layer 114 and the conductive line 102, between the ferroelectric material layer 114 and the channel pillar 106, and between the ferroelectric material layer 114 and the conductive line 108. In some embodiments, the top surface S3 of the gate pillar 110, the top surface S4 of the ferroelectric material layer 114, and the top surface S5 of the dielectric layer 112 may be coplanar. In some embodiments, the material of the ferroelectric material layer 114 may include hafnium zirconium oxide.

In some embodiments, as shown in FIG. 2 and FIG. 4, the top-view pattern of the channel pillar 106 may surround the top-view pattern of the gate pillar 110, the top-view pattern of the ferroelectric material layer 114, and the top-view pattern of the dielectric layer 112. Since the top-view pattern of the channel pillar 106 may surround the top-view pattern of the gate pillar 110, the channel pillar 106 may be called "channel-all-around (CAA)". In some embodiments, as shown in as shown in FIG. 2 and FIG. 4, the top-view pattern of the conductive line 108 may surround the top-view pattern of the gate pillar 110, the top-view pattern of the ferroelectric material layer 114, and the top-view pattern of the dielectric layer 112. In some embodiments, as shown in FIG. 2 and FIG. 4, the top-view pattern of the dielectric layer 112 may surround the top-view pattern of the gate pillar 110 and the top-view pattern of the ferroelectric material layer 114. In some embodiments, as shown in FIG. 2 and FIG. 4, the top-view pattern of the ferroelectric material layer 114 may surround the top-view pattern of the gate pillar 110.

The ferroelectric memory structure 10 may further include a conductive line 116. The conductive line 116 is electrically connected to the gate pillar 110. The conductive line 116 may be located on the gate pillar 110. In some embodiments, the conductive line 116 may be further located on the ferroelectric material layer 114 and the dielectric layer 112. In some embodiments, the conductive line 116 may be used as a word line. In some embodiments, as shown in FIG. 3, the conductive line 116 may extend in the extension direction D3. In some embodiments, the extension direction D3 of the conductive line 116 may intersect the extension direction D1 of the conductive line 102 and the extension direction D2 of the conductive line 108. In some embodiments, the extension direction D3 of the conductive line 116 may be perpendicular to the extension direction D1 of the conductive line 102 and the extension direction D2 of the conductive line 108. In some embodiments, the material of the conductive line 116 may include a conductive material such as metal. In some embodiments, the material of the conductive line 116 may include tungsten, copper, or aluminum.

The ferroelectric memory structure 10 may further include a dielectric layer 118. The dielectric layer 118 is located on the conductive line 108. The gate pillar 110 may pass through the dielectric layer 118. In some embodiments, the dielectric layer 112 may be located between the gate pillar 110 and the dielectric layer 118. In some embodiments, the dielectric layer 112 may be located between the ferroelectric material layer 114 and the dielectric layer 118. In some embodiments, the conductive line 116 may be located on the dielectric layer 118. In some embodiments, the top surface S3 of the gate pillar 110, the top surface S4 of the ferroelectric material layer 114, the top surface S5 of the dielectric layer 112, and the top surface S6 of the dielectric layer 118 may be coplanar. In some embodiments, the material of the dielectric layer 116 may include silicon oxide.

In some embodiments, as shown in FIG. 1 and FIG. 3, the memory cell MC may be located at the intersection of the top-view pattern of the conductive line 108 and the top-view pattern of the conductive line 116. The memory cell MC may include the conductive line 102, the channel pillar 106, the conductive line 108, the gate pillar 110, the dielectric layer 112, and the ferroelectric material layer 114. In some embodiments, a plurality of memory cells MC may form a memory cell array. In some embodiments, a plurality of memory cells MC may be stacked to form a three-dimensional (3D) memory array.

Based on the above embodiments, in the ferroelectric memory structure 10, the dielectric layer 104 is located on the conductive line 102. The channel pillar 106 is located on the conductive line 102 and is located in the dielectric layer 104. The conductive line 108 is located on the dielectric layer 104 and the channel pillar 106. The gate pillar 110 passes through the conductive line 108 and is located in the channel pillar 106. The dielectric layer 112 is located between the gate pillar 110 and the conductive line 102, between the gate pillar 110 and the channel pillar 106, and between the gate pillar 110 and the conductive line 108. The ferroelectric material layer 114 is located between the gate pillar 110 and the dielectric layer 112. Therefore, the ferroelectric memory structure 10 can have a smaller device size, a larger gate width, and better electrical performance (e.g., low leakage current and low parasitic capacitance). In addition, the manufacturing process of the ferroelectric memory structure 10 can be easily integrated with the manufacturing process of other semiconductor devices.

In summary, the ferroelectric memory structure of the aforementioned embodiments can have a smaller device size, a larger gate width, and better electrical performance, and the manufacturing process of the ferroelectric memory structure of the aforementioned embodiments can be easily integrated with the manufacturing process of other semiconductor devices.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:
1. A ferroelectric memory structure, comprising:
a substrate;
a first conductive line located on the substrate;
a first dielectric layer located on the first conductive line;
a channel pillar located on the first conductive line and located in the first dielectric layer;
a second conductive line located on the first dielectric layer and the channel pillar;
a gate pillar passing through the second conductive line and located in the channel pillar;
a second dielectric layer located between the gate pillar and the first conductive line, between the gate pillar and the channel pillar, and between the gate pillar and the second conductive line; and
a ferroelectric material layer located between the gate pillar and the second dielectric layer.
2. The ferroelectric memory structure according to claim 1, wherein the channel pillar is located between the first conductive line and the second conductive line.
3. The ferroelectric memory structure according to claim 1, wherein the channel pillar is in direct contact with the first conductive line and the second conductive line.
4. The ferroelectric memory structure according to claim 1, wherein a material of the channel pillar comprises an oxide semiconductor.
5. The ferroelectric memory structure according to claim 4, wherein the material of the channel pillar comprises indium gallium zinc oxide.
6. The ferroelectric memory structure according to claim 1, wherein a top surface of the channel pillar and a top surface of the first dielectric layer are coplanar.
7. The ferroelectric memory structure according to claim 1, wherein a top surface of the gate pillar, a top surface of the ferroelectric material layer, and a top surface of the second dielectric layer are coplanar.

8. The ferroelectric memory structure according to claim 1, wherein the second dielectric layer is located between the ferroelectric material layer and the first conductive line, between the ferroelectric material layer and the channel pillar, and between the ferroelectric material layer and the second conductive line between.

9. The ferroelectric memory structure according to claim 1, wherein a top-view pattern of the channel pillar surrounds a top-view pattern of the gate pillar, a top-view pattern of the ferroelectric material layer, and a top-view pattern of the second dielectric layer.

10. The ferroelectric memory structure according to claim 1, wherein a top-view pattern of the second conductive line surrounds a top-view pattern of the gate pillar, a top-view pattern of the ferroelectric material layer, and a top-view pattern of the second dielectric layer.

11. The ferroelectric memory structure according to claim 1, wherein a top-view pattern of the second dielectric layer surrounds a top-view pattern of the gate pillar and a top-view pattern of the ferroelectric material layer.

12. The ferroelectric memory structure according to claim 1, wherein a top-view pattern of the ferroelectric material layer surrounds a top-view pattern of the gate pillar.

13. The ferroelectric memory structure according to claim 1, wherein a material of the ferroelectric material layer comprises hafnium zirconium oxide.

14. The ferroelectric memory structure according to claim 1, further comprising:
a third conductive line electrically connected to the gate pillar.

15. The ferroelectric memory structure according to claim 14, wherein the third conductive line is located on the gate pillar.

16. The ferroelectric memory structure according to claim 15, wherein the third conductive line is further located on the ferroelectric material layer and the second dielectric layer.

17. The ferroelectric memory structure according to claim 14, wherein an extension direction of the third conductive line intersects an extension direction of the first conductive line and an extension direction of the second conductive line.

18. The ferroelectric memory structure according to claim 14, further comprising:
a third dielectric layer located on the second conductive line.

19. The ferroelectric memory structure according to claim 18, wherein the gate pillar passes through the third dielectric layer.

20. The ferroelectric memory structure according to claim 18, wherein the third conductive line is located on the third dielectric layer.

* * * * *